United States Patent [19]
Tsuda

[11] Patent Number: 5,974,098
[45] Date of Patent: Oct. 26, 1999

[54] RECEIVED SIGNAL DETECTOR FOR DIGITAL DEMODULATOR

[75] Inventor: Hiroki Tsuda, Tokyo, Japan

[73] Assignee: NEC Corporation, Tokyo, Japan

[21] Appl. No.: 08/955,239

[22] Filed: Oct. 21, 1997

Related U.S. Application Data

[63] Continuation of application No. 08/527,190, Sep. 12, 1995, abandoned.

[30] Foreign Application Priority Data

Sep. 12, 1994 [JP] Japan .................................. 6-217352

[51] Int. Cl.$^6$ .............................. H03D 1/00; H04L 27/06
[52] U.S. Cl. .......................... 375/340; 375/344; 455/316; 455/257
[58] Field of Search .................................. 375/316, 317, 375/324, 340, 325, 326, 328, 339, 344; 329/304, 306–308; 455/227, 255–260, 264–266, 316, 315

[56] References Cited

U.S. PATENT DOCUMENTS

| | | |
|---|---|---|
| 3,493,866 | 2/1970 | Miller . |
| 4,203,070 | 5/1980 | Bowles et al. .......................... 375/317 |
| 4,280,219 | 7/1981 | Lowenschuss et al. ................ 375/317 |
| 4,619,002 | 10/1986 | Thro ........................................ 375/317 |
| 4,871,973 | 10/1989 | Yoshihara ............................... 329/308 |
| 4,962,508 | 10/1990 | Kingston ................................. 375/200 |
| 4,969,160 | 11/1990 | Kingston ................................. 375/200 |
| 5,272,724 | 12/1993 | Solomon et al. ....................... 375/316 |
| 5,396,521 | 3/1995 | Minami ................................... 375/317 |
| 5,416,802 | 5/1995 | Ishii ........................................ 375/316 |
| 5,574,750 | 11/1996 | Peponides et al. ..................... 375/224 |
| 5,596,323 | 1/1997 | Erhage .................................... 375/324 |

FOREIGN PATENT DOCUMENTS

2-101826  4/1990  Japan .

OTHER PUBLICATIONS

N. Morinaga et al., "Trends in Modulation/Demodulation and Coding Techniques for Mobile Satellite Communications Systems", IEICE Transactions, vol. E 74, No. 8, Aug. 1991, pp. 2211–2219.

*Primary Examiner*—Chi H. Pham
*Assistant Examiner*—Jean B Corrielus
*Attorney, Agent, or Firm*—Sughrue, Mion, Zinn, Macpeak & Seas, PLLC

[57] ABSTRACT

The present invention refers to a received signal detector for detecting and demodulating a digital modulated signal wherein a signal detection in a short time can be implemented independently of the signal frame length. The wide-band filter is a filter having a pass frequency band set to the frequency range of received signals to be demodulated. The A/D convertor, first power detector and first averaging circuit measure the average power of a signal having passed through the wide-band filter. The threshold setting circuit sets a threshold from the averaged power. The narrow-band filter filters an output signal of the frequency convertor in a narrower frequency band than the pass frequency band of the wide-band filter. The comparator circuit compares the threshold and the average power of a signal taken out from the second averaging circuit and passing through the narrow-band filter and judges whether the received signal is taken out from the wide-band filter.

16 Claims, 7 Drawing Sheets

RECEIVED SIGNAL DETECTOR FOR DIGITAL DEMODULATOR

This is a continuation of application Ser. No. 08/527,190 filed Sep. 12, 1995 now abandoned.

BACKGROUND OF THE INVENTION

1. Field of the Invention

The present invention relates to a signal detector, and, more particularly, to a signal detector for detecting and demodulating a digital modulated signal received in the satellite communication for transmitting a digital modulated signal.

2. Description of the Related Art

In the satellite communication for information transmission via an artificial satellite, an carrier frequency offset caused by a Doppler shift, drift of a local oscillator on a transmitter and the satellite and a residual frequency error of an automatic frequency control (AFC). Especially, at a satellite station for downsizing and cost-saving, there are cases of using a low-stability oscillator and accordingly the influence of the carrier frequency offset becomes greater. For this reason, various signal detectors equipped with measures to achieve an early phase synchronization even in the presence of such frequency offset have so far been known on a receiver.

FIG. 1 shows a block diagram of one example of conventional signal detector. As shown in FIG. 1, out of a signal received via a satellite communication path, the frequency component of a predetermined signal range is filtered through a Nyquist filter 61 and supplied to a multiplier 62 to be multiplied by a signal from a voltage control oscillator (VCO) 66 here. After phase error detection by a phase detector 63, an output signal from the multiplier 62 is supplied through a loop filter 64 to an adder 65 to be added to a signal from the frequency sweep control circuit 69 mentioned later 69, then applied to VCO 66 as control voltage to variably control the output oscillation frequency thereof.

A phase lock loop comprising the above the multiplier 62, the phase detector 63, the loop filter 64, the adder 65 and the VCO 66 constitutes a phase lock loop (PLL), while decoded data are taken out from the multiplier 62.

Generally, in a coherent detection scheme such as the PLL, it is arranged that the VCO 66 to output a reference carrier is first swept until the carrier is captured and a rapid carrier phase acquisition can be possible even in the presence of carrier frequency offset. In this carrier phase acquisition process, the bandwidth of the phase lock loop is made wider so that the frequency pull-in range of the PLL is widened and the phase acquisition time shortens. Once the carrier is acquired, the bandwidth of a loop is made narrower so that following and holding the phase lock becomes more favorable against a noise. In other words, to satisfy mutually contrary requirements in the carrier acquisition process and after the acquisition, switching the loop bandwidth is required. Thus, means for controlling the sweep of the reference carrier and the switchover of the PLL need to be provided. As regards this prior art, there is a description, for example, in U.S. Pat. No. 4,871,973.

Furthermore, in the mobile satellite communications directed to mobile terminals or mobile stations such as cars, ships and airplanes, the environment on transmission path differs from that of a satellite communication between fixed stations and countermeasures be required in which the environment is taken into consideration. For example, for attenuation of received signals (shadowing) caused by a building, trees, poles-or other obstacles on the transmission path, immediately detect a shadowing state, stop an unnecessary processing or control during shadowing and hold a state of being shown in a phase synchronized state so that the phase lock is again established rapidly after a signal is recovered. At that time, means for detecting a shadowing and preparing for the shadowing and means for starting a rapid re-acquisition processing after the recovery of a signal are required.

And, according to a conventional device shown in FIG. 1, after detecting a unique word out of the decoded data. taken from the multiplier 66 with aide of a unique word (UW) detection circuit 67, supplying the detected signal to the frame synchronization circuit 68 and judging whether the frame synchronization is established or not, the frequency sweep control circuit 69 is controlled on the basis of the judged results and a frequency sweep operation, loop band switching and control during shadowing are performed in accordance with a control signal issued from the frequency sweep control circuit 69 to the adder 65.

When estimating the carrier frequency offset by means of Fourier transformation and acquiring the carrier, by sampling data after the detection of an input signal and processing the sampled data, to acquire the carrier efficiently and with high reliability is made possible. For this reason, detecting an input signal becomes an important key.

Thus, received signal detectors has thus far been known for detecting the input signals of a predetermined frequency from input signals of various frequencies by using a wide-band filter and a narrow-band filter (Japanese Patent Laid-Open Publication No. 101826/1990). FIG. 2 is a block diagram of such a conventional received signal detector.

In this conventional received signal detector, received signals having passed through a wide-band filter 71 having a wide pass frequency band are supplied to each of the narrow-band filters 72 and 73. The narrow-band filter 72 has a narrow-band frequency characteristic allowing signals of a desired band around a predetermined frequency f1 to pass. On the other hand, the narrow-band filter 73 has a narrow-band frequency characteristic allowing signals of a band around a predetermined frequency f2 adjacent to said predetermined frequency f1 to pass.

Thus, from the narrow-band filter 72, signals of a desired signal band around the frequency f1, noise included, are taken out and power is detected by a power detector 74, then averaged by the averaging circuit 76 and supplied to the comparator circuit 79. On the other hand, from the narrow-band filter 73, almost noise components of a band around the frequency f2 are taken out and power is detected by a power detector 75, then averaged by the averaging circuit 77 and supplied to the threshold setting circuit 78.

The threshold setting circuit 78 sets a threshold serving as the reference for the detection of signals in dependence on an input level. The comparator circuit 79 compares the signal level in a desired signal band from the averaging circuit 76 and the threshold from the threshold setting circuit 78 and outputs a detection signal showing that a signal in the desired signal band has been received if the signal level in the desired signal band is higher than the threshold.

Above described conventional apparatus has some problems as follows.

The apparatus requires an implicated external circuit for avoiding false UW detections in case of the frame synchronization.

And, as with the mobile satellite communications, to diffuse a burst error caused by shadowing, the transmitter interleaves data including UW in a long frame unit (the frame length for interleave depends on a shadowing time, a received power variation period or the like) before transmission. In order to cope with this, the receiver detects an interleaved UW in the frame and achieves the synchronization. Accordingly, if the frame length need to be made longer, the conventional apparatus has a problem that it takes so much time for lengthening the frame length to achieve the frame synchronization.

In addition, the above conventional apparatus shown in FIG. 2 has a problem that the need not only of a power measuring system for signals themselves but also of another power measuring system for setting the standard of signal detection brings about an increase in hardware scale and an increase in signal processing.

SUMMARY OF THE INVENTION

It is one object of the present invention to provide a received signal detector capable of detecting a received signal in a short time by using a simple circuitry.

It is another object of the present invention to provide a received signal detector capable of detecting a received signal with high reliability even in the presence of fluctuations in the level of input signals.

It is still another object of the present invention to provide a received signal detector widely applicable to various controls, such as in estimating the frequency of a carrier and capturing the carrier frequency.

To attain the above objects, the present invention provides a received-signal detector for digital demodulators, comprising: a wide-band filter for filtering a received signal of the frequency band to be demodulated; first averaged power measuring means for measuring the averaged power of a received signal having passed through said wide-band filter; a threshold setting circuit for setting a threshold in accordance with the output measurement averaged power of said first average power measuring means; a frequency converter for the frequency conversion of a received signal having passed through said wide-band filter by using a frequency conversion signal; a narrow-band filter for filtering an output signal of said frequency converter in a narrower frequency band than the passing frequency band of said wide-band filter; second averaged power measuring means for measuring the averaged power of a signal having passed through said narrow-band filter; and a comparator circuit for comparing said threshold and the output measurement averaged power and judging whether the received signal is taken out from said wide-band filter.

In fields represented by satellite communication where normally the received electric field is low and thermal noise is uniformly distributed over a wide frequency range, a received signal having passed through the wide-band filter contains such thermal noise and the thermal noise power is so much higher for a wider pass frequency band than that of the narrow-band filter in comparison with received signals having passed through the narrow-band filter. Thus, in the input case of a received signal, the ratio of average power measured by the second power measuring means after passage of one and the same signal through a narrow-band filter is greater than that of average power measured by the first power measuring means after passage through a wide-band filter and therefore it can be judged whether a signal is received or not.

Thus, comparing the threshold set by the threshold setting circuit in accordance with the output measurement average power obtained from the first average power measuring means and the output measurement average power obtained from the second average power measuring means with the aid of the comparison means makes it possible to judge whether a received signal is taken out from the wide-band filter (a signal is received) or not.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DESCRIPTION OF THE PREFERRED EMBODIMENT OF THE INVENTION

Figure 3:
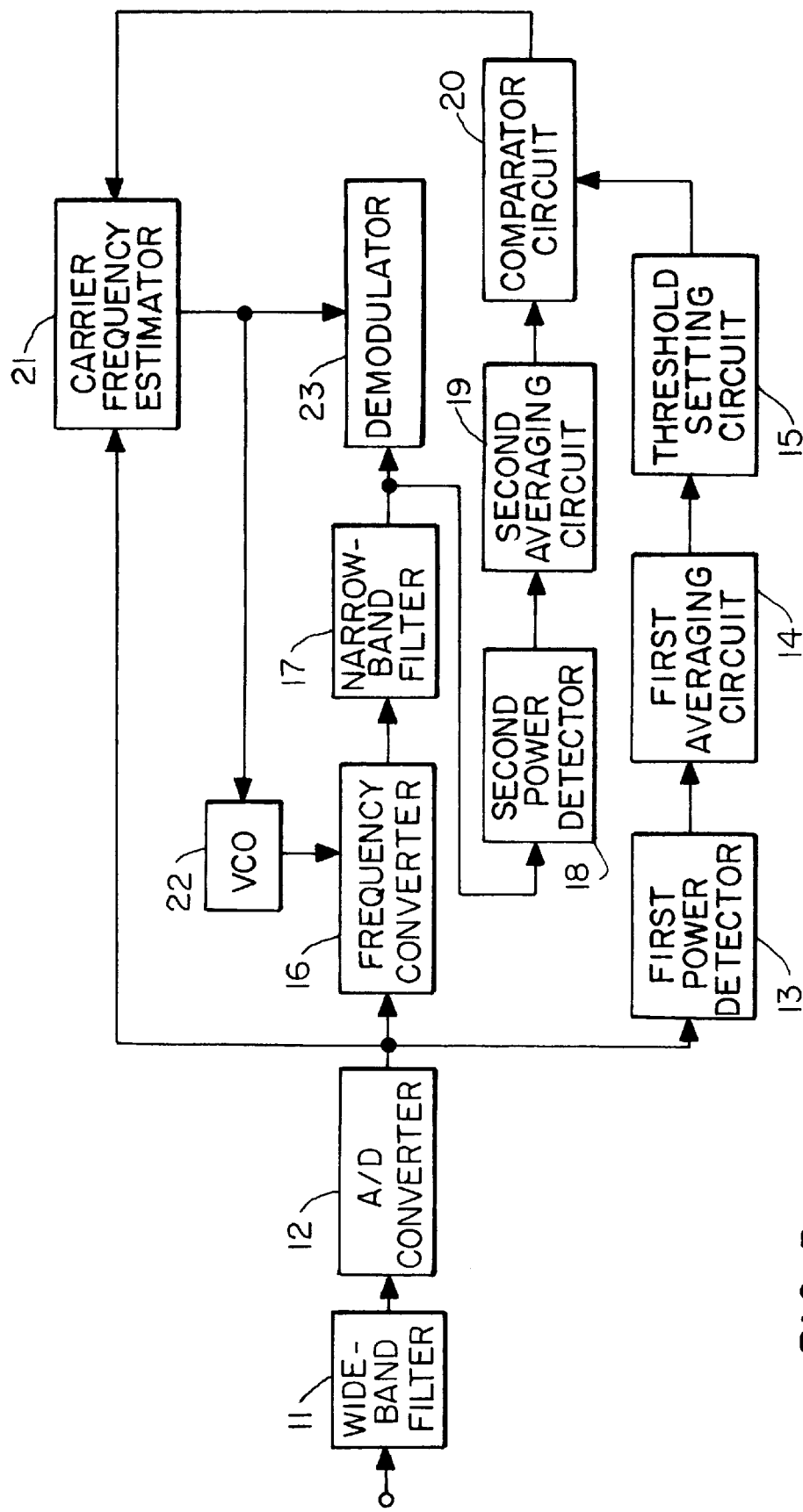
FIG. 3 is a block diagram showing one embodiment of the present invention.

Hereinafter, one embodiment of the present invention will be described. FIG. 3 is a block diagram showing one embodiment of the present invention. In a satellite communication for transmitting a modulated signal, for example, (PSK signal) modulated by a kind of digital modulation (PSK: Phase Shift Keying), this embodiment comprises a wide-band filter 11 for filtering a received signal of the frequency band to be demodulated; an A/D convertor 12 for converting an analog signal into a digital signal; a first power detector 13 for measuring the power of an output signal from the wide-band filter 11; a first average circuit 14 for averaging the power measured by the first power detector 13; a threshold setting circuit 15 for setting a threshold in accordance with the power averaged by the first average circuit; a frequency convertor 16 for the frequency conversion; a narrow-band filter 17 having a narrow-band pass frequency characteristic as a Nyquist filter suitable for the satellite system; a second power detector 18 for measuring the output power of the narrow-band filter 17; a second average circuit 19 for averaging the power measured by the second power detector 18 and a comparator circuit 20 for comparing the threshold set by the threshold setting circuit 15 and the power averaged by the second average circuit 19; a carrier frequency estimator 21 for sampling received signals and estimating the frequency of a carrier from the sampling data; a VCO 22 whose oscillation frequency is variably controlled by the control voltage; and a demodulator 23 for demodulating the received signal.

Next, operations of this embodiment having the above configuration will be described. In a received signal, the frequency component of a desired frequency band to be demodulated is filtered by the wide-band filter 11 and supplied to the A/D convertor 12. The wide-band filter 11 is a filter serving as an anti-aliasing filter (folding distortion removing filter) for suppressing the signal components in a frequency band higher than allowed in the sampling of received signals. The A/D convertor 12 samples output signals of this wide-band filter 11 in accordance with the sampling clock, converts the sampled signals into digital signals and supplied them to each of the first power detector 13 and the frequency convertor 16. Incidentally, the position of this wide-band filter is not limited to the front end of the A/D convertor 12 as with FIG. 3, but may come after the rear end thereof. At this time, a digital filter can be used for the wide-band filter 11 and is desirable from the standpoint of downsizing.

The first power detector 13 measures the power of the frequency components filtered by the wide-band filter 11 in accordance with an input digital signal and supplies the measured result to the first average circuit 14. The first average circuit 14 averages a definite number of sample values in sequence from a series of input power measurement results by operations according to the following expression.

[Expression 1] (1)

$$u = \frac{1}{m} \sum_{i=p}^{p+m-1} x_i$$

where u: average of an m sample value series and $x_i$: i-th sample value.

Also, the second averaging circuit 19 of similar configuration can be used. Here, the averaging circuit is only required to perform a computation according to the formula and can be easily arranged by using a digital signal processing.

Figure 4:
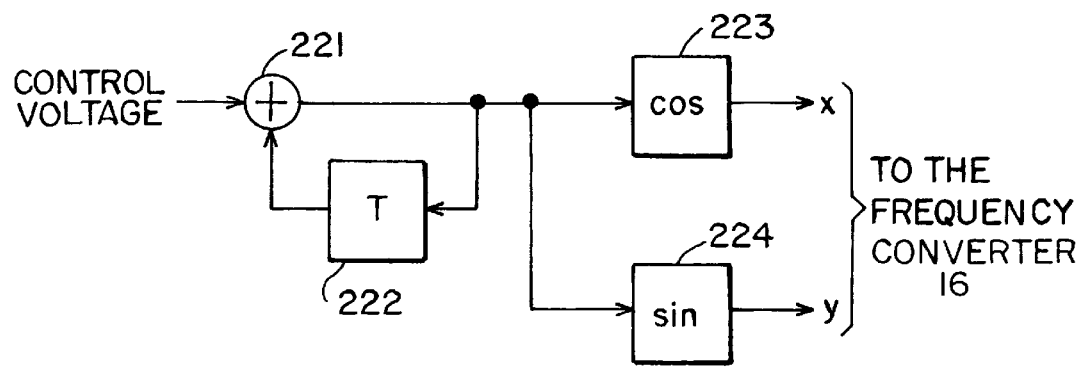
FIG. 4 is a configurational drawing of one example of the VCO shown in FIG. 3.

Output digital signals (sample value series) of the A/D convertor 12 is supplied also to the frequency convertor 16 to be converted in frequency with reference of an output signal of the VCO 22 set to the initial value at the time of capturing a carrier herein. This VCO 22 can be configured by using a digital processing and comprises, for example, an adder 221, delay means (accumulator) 222, a cosine wave store lookup table 223 and a sine wave store lookup table 224 as shown in FIG. 4.

The VCO 22 of such configuration integrates an input control voltage by using a close loop circuit comprising an adder 221 and delay means 222 and supplies the integrated result to the cosine wave store lookup table 223 and the sine wave store lookup table 224 as address, so that the in-phase component x and the perpendicular component y are output from the cosine wave store lookup table 223 and the sine wave store lookup table 224, respectively, to the frequency convertor 16 of FIG. 3.

Figure 5:
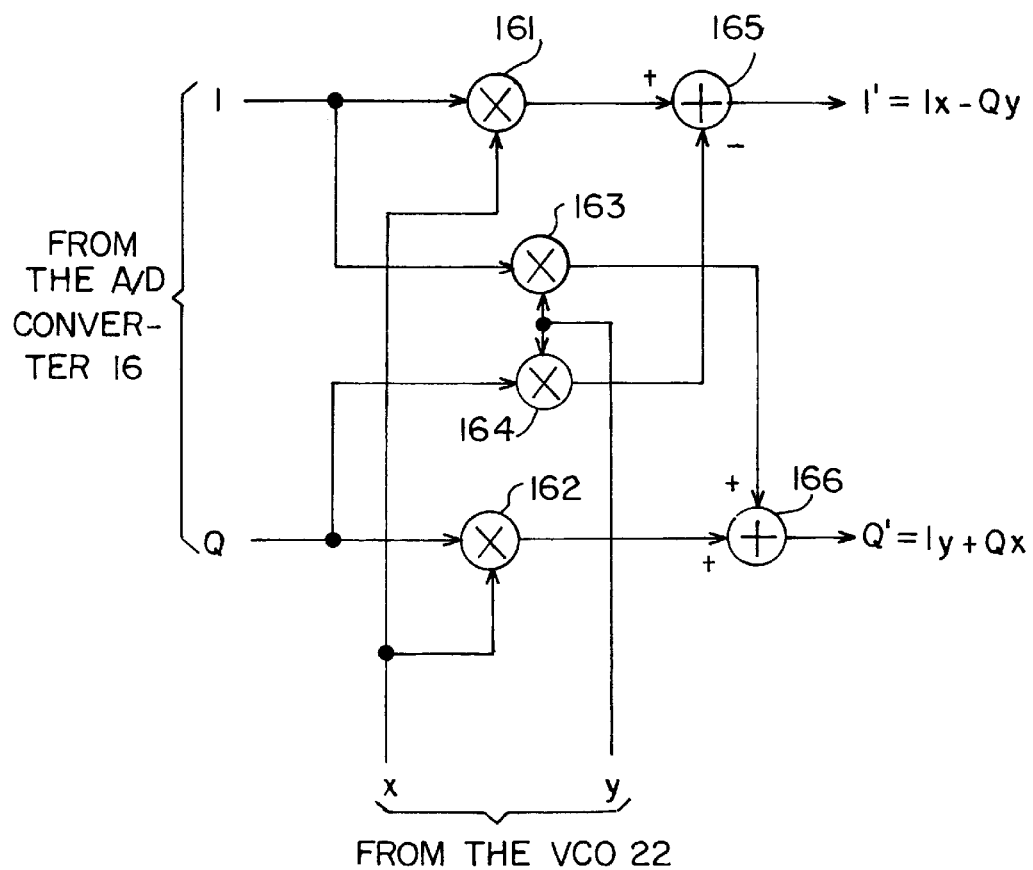
FIG. 5 is a configurational drawing of one example of the frequency convertor shown in FIG. 3.

The frequency convertor 16 is a circuit for frequency-converting an output signal of the A/D convertor 12 and an output signal of the VCO 22 by means of complex multiplication and comprises, for example, multipliers 161, 162, 163 and 164 and adders 165 and 166 as shown in FIG. 5. In this frequency convertor 16, the in-phase component I of an output digital signal of the A/D convertor 12 and the output signals x and y of the VCO 22 are multiplied by means of multipliers 161 and 163, whereas the quadrature component Q of an output digital signal of the A/D convertor 12 and the output signals x and y of the VCO 22 are multiplied by means of multipliers 162 and 164.

By subtracting the output multiplied result of the multiplier 164 and the adder 165 from that of the multiplier 161, the frequency-converted in-phase component I' (=Ix−Qy) is output, whereas the frequency-converted quadrature component Q' (=Iy+Qx) is output by supplying the output multiplied results of the multipliers 162 and 163 to the adder 166 and adding both of them.

Returning again to FIG. 3, the description will be continued. In the signal taken out after the frequency conversion by the frequency convertor 16, the frequency band component of a predetermined narrow band is filtered by the narrow-band filter 17 as Nyquist filter which provides intersymbol interference free transmission by the minimum channel bandwidth. By using a publicly known transversal filter, the narrow-band filter 17 can easily execute a digital processing. After supplied to the second power detector 18 for voltage measurement, an output signal of the narrow-band filter 17 is supplied to the averaging circuit 19 and averaged.

Normally in the satellite communications, a received electric field is low and affected by the thermal noise in the receiver. The thermal noise is assumed to be a white Gaussian noise and has a flat power spectral density over a wide frequency range. Thus, the average power of received signals observed through a wide-band filter 11 includes the thermal noise power of a pass band portion through the wide-band filter 11 and a different power value is observed between while receiving signals and while receiving no signal.

For example, as shown in FIG. 6(A), if there is a received signal for a period of the time t1–t3 and for a period of the time t6 and later and there is no received signal for a period of the time t1 and former and for a period of the time t3–t5, the average power of received signals observed through a wide-band filter 11 gradually rises immediately after the input time of a received signal t1, t5, reaches a maximum, maintains that value during input of received signals and gradually decreases after the time t3 when a received signal is interrupted as shown by (1) in FIG. 6(B).

On the other hand, a so much smaller amount of noise power is contained in the average power ((2) of FIG. 6(B)) of received signals observed through a narrow-band filter 17 shown in FIG. 3 for a narrow pass band portion than is contained in the average power ((1) of FIG. 6(B)) of received signals observed through a wide-band filter 11. Next, the ratio of power observed after passing through the wide-band filter 11 and after passing through the narrow-band filter 17 will be compared between with and without input signal, respectively. For simplicity of description, the description will proceed referring to a concrete example.

First, the pass band of a filter will be shown. For example, when a modulated speed is 4 k baud, since the arrow-band filter 17 is the Nyquist filter, a low-pass filter having a band width of 4 kHz is used. On the other hand, the wide-band filter 11 is favorable for signal detection if having a sufficiently wide band width in comparison with the narrow-band filter 17, but so much greater amount of noise is input to the demodulator loop, there leading to a decrease in characteristic.

Accordingly, this embodiment comprises a wide-band filter having a four times wider pass band than that of the narrow-band filter 17, that is, employs a low-pass filter having a band width of 16 kHz. A filter output power without input signal (noise power) is proportional to the pass frequency band width because of uniform distribution of noise distribution in pass frequency band and therefore the noise power $P_W$ observed after passage through the wide-band filter 11 becomes four times that $P_N$ observed after passage through the narrow-band filter 17 ($P_W/P_N=4$).

Generally in the satellite communication, since the noise distribution while receiving no signal has a flat power spectral density over a wide band and the quantity of noise is sufficiently large, the ratio mentioned above holds accurately.

On the other hand, assuming that a signal having a power PS equal to the noise power PN observed after passage through the narrow-band filter 17, the power ratio observed after passage through the wide-band filter 11 (equal to (output power while receiving signals)/(output power while receiving no signal) becomes 5/4 as indicated by the following expression:

[Expression 2] (2)

$$\frac{P_W + P_S}{P_W} = \frac{P_W + P_N}{P_W} = \frac{P_W + \frac{P_W}{4}}{P_W} = \frac{5}{4}$$

In contrast to this, the power ratio observed after passage through the narrow-band filter 17 becomes greater than the above power ratio observed after passage through the wide-band filter 11 [5/4] as indicated by the following expression:

[Expression 3] (3)

$$\frac{P_N + P_S}{P_N} = \frac{P_N + P_N}{P_N} = 2$$

Therefore, the ratio of average power when receiving signals to that when not receiving signals becomes greater for the average power obtained through the narrow-band filter than that through the wide-band filter.

Thus, in this embodiment, to make use of this in accordance with average power, as indicated by (1) in FIG. 6(B), obtained in the first averaging circuit 14 from signals measured through the wide-band filter 11, the threshold setting circuit 15 sets the threshold that can distinguish the time of signal input and the time of no signal input from the level comparison with the average level of signals passing through the narrow-band filter 17 as indicated by (3) in FIG. 6(B) and supplies this threshold to the comparator circuit 20. That is, this threshold is only required to be voltage-divided into 1/n so that the output voltage (1) of the first average circuit 14 comes between a value for no signal input and a value for no received signal of (3). The threshold setting circuit 15 is provided with this 1/n voltage divider circuit.

The comparator circuit 20 compares this threshold with the power obtained by averaging the power measured through the narrow-band filter 17 and the second detector 18 in the second averaging circuit 19 and judges whether an input received signal is present or absent (a received signal is taken out from the wide-band filter 11 or not).

Figure 6:
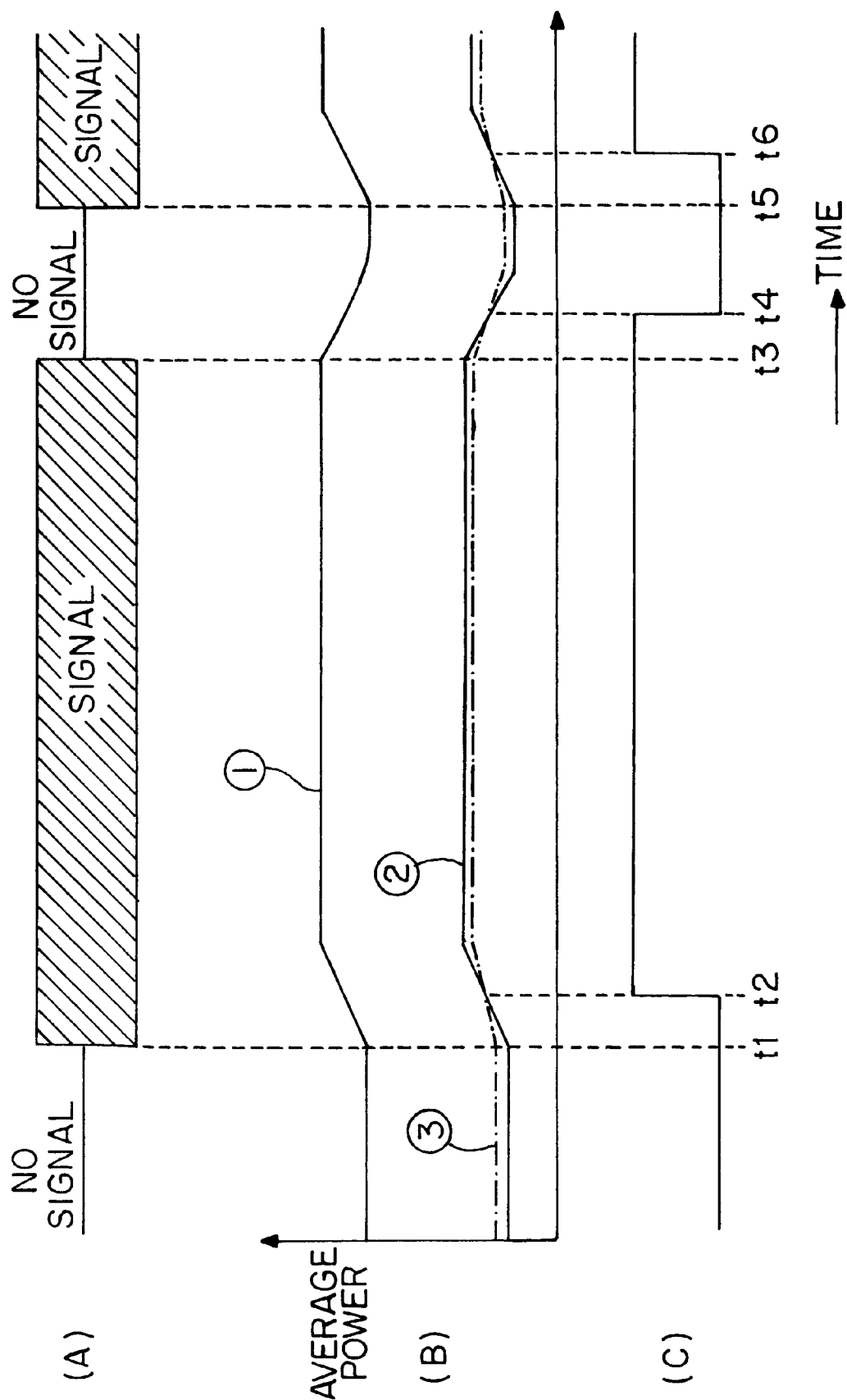
FIG. 6 is a time chart for the description of operations of the embodiment of FIG. 3.

That is, if the above average power is of a larger level than that of the threshold (for a period of the time t2–t4, the time t6 and later in FIG. 6) the comparator circuit 20 judges that a received signal is input and outputs a high-level signal, whereas it judges that no received signal is input and outputs a low-level signal if the average power is of a smaller level than that of the threshold (the time t2 and former, for a period of the time t4–t6 in FIG. 6). FIG. 6(C) shows the waveform of an output signal of this comparator circuit 20.

When an output signal of this comparator circuit 20 is of a high level, that is, when it is judged a received signal is input and taken out from the wide-band filter 11, the carrier frequency estimator 21 samples output digital signals of the A/D convertor 12, obtains data for estimating the carrier frequency, multiplies a frequency of the data and estimates the carrier frequency from the frequency spectrum obtained by a fast Fourier transformation (FFT).

The output signal of this carrier frequency estimator 21 is applied to the VCO 22 as control voltage, so that an estimated frequency is output from the VCO 22 and frequency-converted with the received signal in the frequency convertor 16. Then, the demodulator 23, to which the output signal of this frequency convertor is supplied through the narrow-band filter 17, captures a carrier and demodulate the received signal.

In this way, according to this embodiment, the demodulation function is implemented by using a digital operation and accordingly can detect a received signal in a relatively simple circuitry, saving the processing of a received signal alone and using a hardware processing needed for digital conversion and demodulation. In addition, no use of frame synchronization detection enables the signal detection to be executed independently of the signal frame length and in a short time.

Furthermore, because, referring to the average power of a received signal observed after passage through the wide-band filter 11, a relative judgment of signal detection is performed from the average power of a received signal observed after passage through the narrow-band filter 17, a received signal can be detected with high reliability even in the presence of a fluctuation in the level of the received signal.

This detection of a received signal is applicable to a frequency sweep control at the time of capturing a carrier frequency, a switching control to the optimum loop band for holding or establishing the carrier phase lock, the hold of carrier and clock phase information during shadowing and the stop of the AFC.

Figure 7:
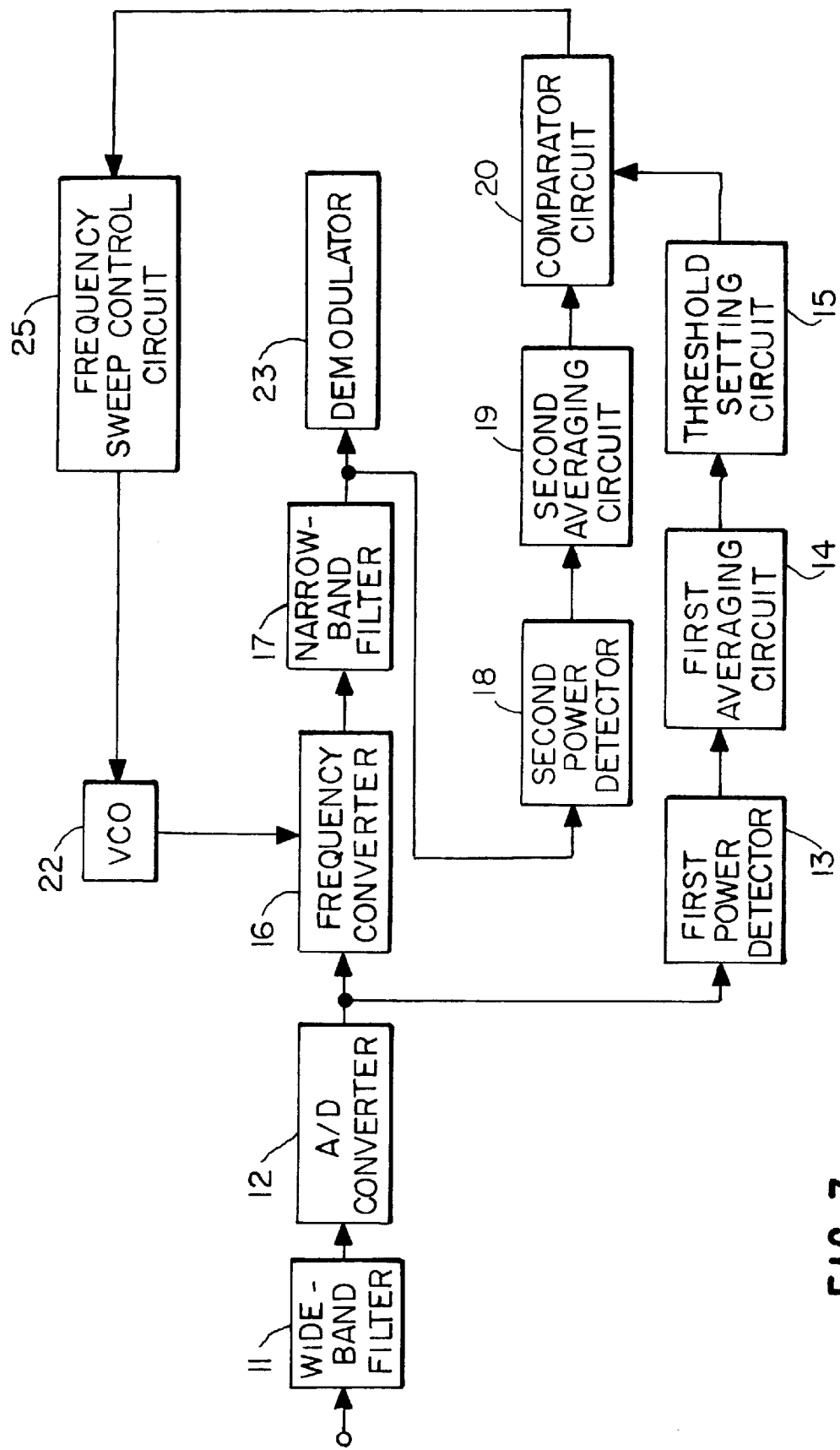
FIG. 7 is a block diagram of one application of the present invention to the frequency sweep control for the capture of a carrier frequency.

FIG. 7 is a block diagram in the application of the inventive apparatus to a frequency sweep control for the capture of a carrier frequency. In FIG. 7, like symbols are attached to constituents similar to those in FIG. 3 and the relevant description will be omitted. In FIG. 7, for a period that an output signal of the comparator circuit 20 detects no received signal, the frequency sweep control circuit 25 outputs a control voltage having a periodically changing oscillation frequency to the VCO 22 so that the oscillation frequency is periodically varying, whereas it maintains the control voltage of that time when the frequency detector detects a received signal. As a result, the VCO 22 outputs a signal having a gradually varying frequency and executes a frequency sweep.

Figure 1:
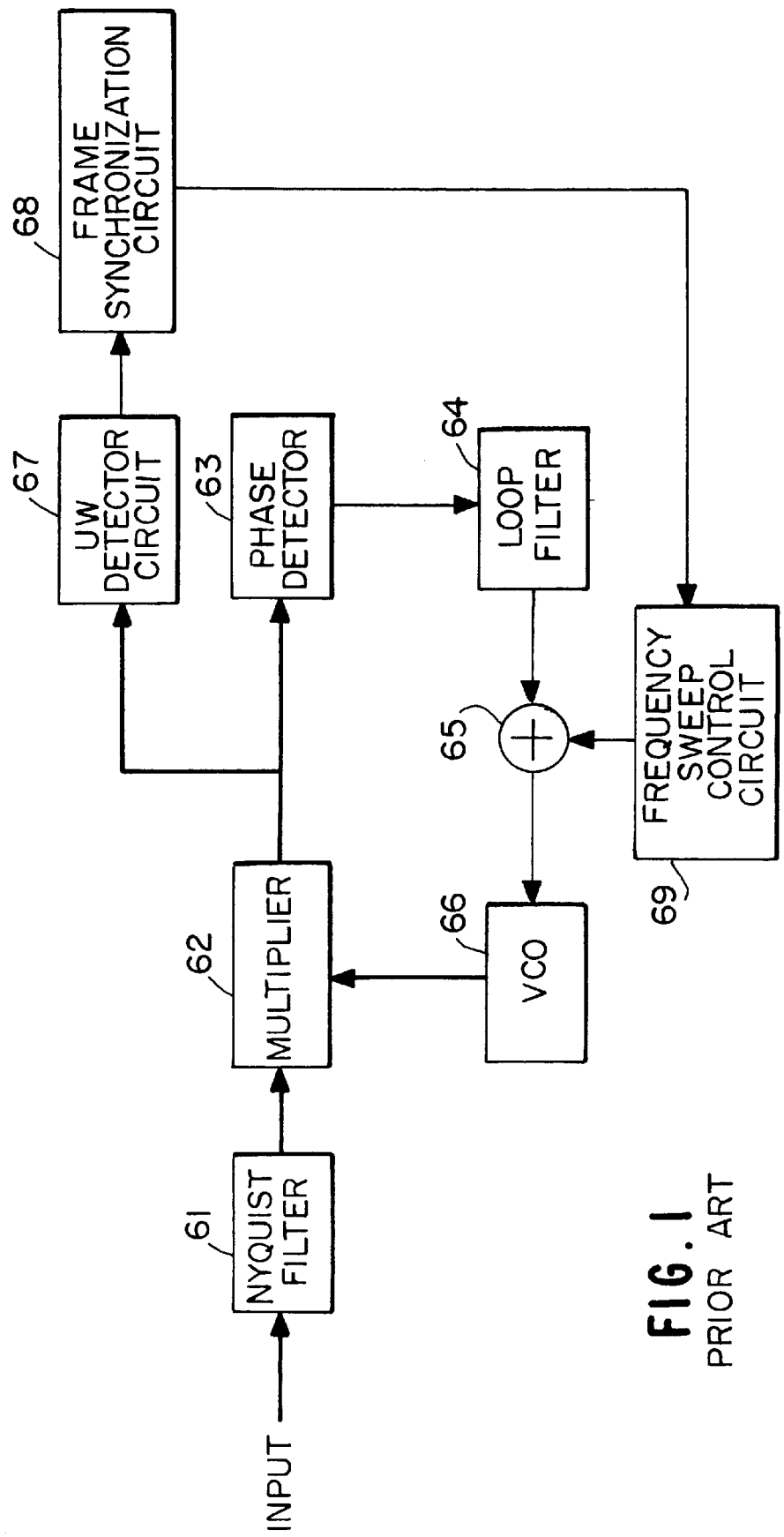
FIG. 1 is a block diagram showing a conventional signal detector.
Figure 2:
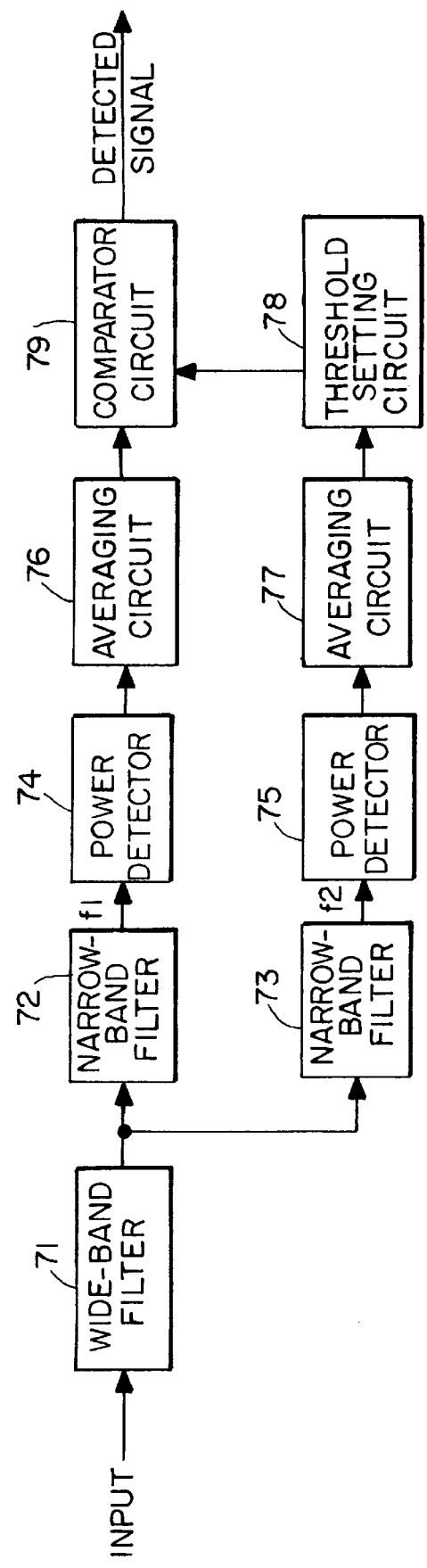
FIG. 2 is a block diagram showing another conventional signal detector.
Figure 8:
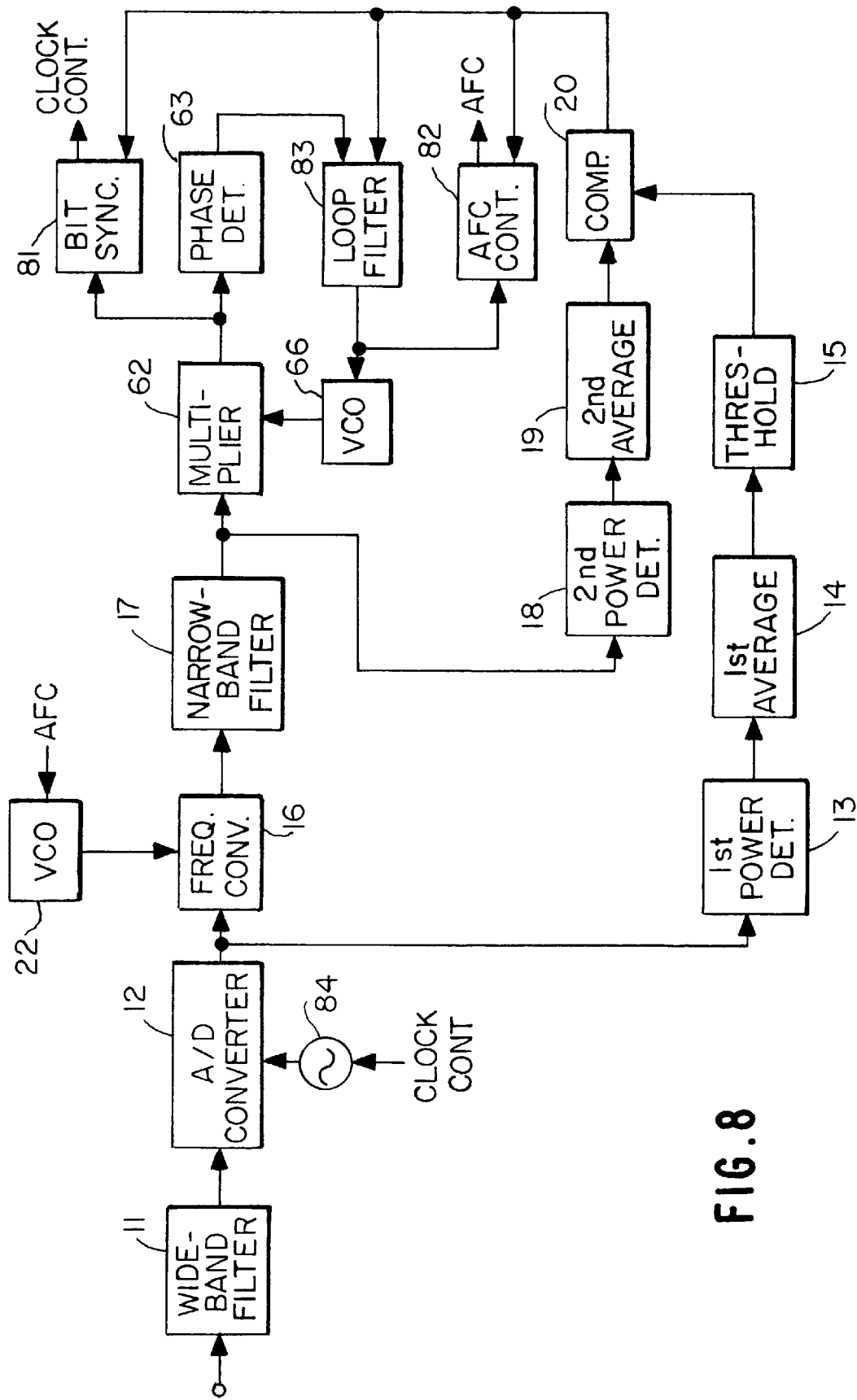
FIG. 8 is a block diagram of another application of the present invention to the switching control to a loop frequency band favorable for holding or establishing the carrier phase synchronization, the hold control of carrier and clock phase information during shadowing and the stop control of the AFC.

FIG. 8 is a block diagram showing the application of an apparatus according to the present invention to a frequency sweep control at the time of capturing a carrier frequency, a switching control to the optimum loop band for holding or establishing the carrier phase lock, the hold of carrier and clock phase information during shadowing and the stop of the AFC. In FIG. 8, like symbols are attached to constituents similar to those in FIGS. 1 and 3 and the relevant description will be omitted. In FIG. 8, the demodulated data taken from an output of the multiplier 62 is input to the bit synchronizer 81 and the clock phase control information is taken out to control the phase of a clock of the VCO 84 for driving the A/D convertor 12. Once when inputting an output of the comparator circuit 20 to the bit synchronizer 81 and detecting the absence of a received signal, the bit synchronizer 81 controls in such a manner that the clock phase control operation stops and the phase information immediately before received signals are interrupted is maintained.

As described also in the description of the related art, according to the PLL detection scheme, in the carrier acquisition process, the band width of a loop is made narrower than set after the carrier phase is locked so that the frequency pull-in range of the PLL is widened and the phase lock shortens.

In FIG. 8, when inputting an output of the comparator circuit 20 to the loop filter 83 and detecting the absence of a received signal in the comparator circuit 20, it is so controlled as to widen the loop band width of the loop filter 83.

Finally, in the AFC operation for controlling the frequency of a reference oscillator (VCO), an output of the loop filter 83 is input to the AFC control 82 and it is so controlled that the frequency of the VCO 22 becomes phase-locked. Also to the AFC control 82, an output of the comparator circuit 20 is input. When the comparator circuit 20 detects the absence of received signals, the AFC control 82 holds the control signal so that the AFC does not misoperate and controls in such a manner as to maintain a reference frequency value immediately before a received input signal is interrupted.

Needless to say, all other embodiments of the present invention than described above can also comprise digital signal processing.

As described above, according to the present invention, because it is judged in the comparator circuit whether the received signal is taken out from the wide-band filter or not (a signal is received or not) by comparing the threshold set by the threshold setting circuit in accordance with the output measurement averaged power of the first average power measuring means and the output measurement averaged power of the second average power measuring means, detecting a received signal in a relatively simple circuitry, saving special hardware and operations needed for the signal detection processing and employing hardware and operations used for demodulation function through digital signal processing, such as DSP (Digital Signal Processing).

Also according to the present invention, the signal detection can be executed independently of the signal frame length and in a short time because a signal detection is not based on the frame synchronization. In addition, a received signal can be detected with high reliability even in the presence of a fluctuation in the level of the received signal.

Furthermore, the present invention is widely applicable to a variety of controls in estimating the frequency of a carrier by supplying this signal detection to the carrier frequency estimator and sampling received signals taken out through the wide-band filter, capturing the carrier frequency by supplying the same to frequency sweep control means for generating a signal having a gradually varying frequency and the like.

What is claimed is:

1. A received signal detector, comprising:
   a wide-band filter for suppressing signal components in a frequency band higher than allowed in a sampling of a received signal modulated by digital modulation, said wide-band filter having output signals;
   an A/D converter for sampling the output signals of said wide-band filter and converting said sampled output signals into digital signals;
   first averaged power measuring means for measuring an averaged power of said digital signals having passed through said A/D converter, said first averaged power measuring means having a first output signal;
   a threshold setting circuit for setting a threshold in accordance with the first output signal measured by said first averaged power measuring means;
   a frequency converter for converting a first frequency of said digital signals having passed through said A/D converter to a second frequency and for adjusting said second frequency into a frequency range of a narrow-band filter, said frequency converter inputting a frequency conversion signal and having converted output signals;
   said narrow-band filter filtering the converted output signals of said frequency converter, said narrow-band filter having narrow-filtered output signals;
   a demodulator that receives and demodulates the narrow-filtered output signals;
   second averaged power measuring means for measuring the averaged power of the narrow-filtered output signals, said second averaged power measuring means having a second output signal;
   a comparator circuit for comparing said threshold and said second output signal and judging whether said received signal is present or absent;
   a carrier frequency estimator for sampling received signals taken out from said wide-band filter and estimating a carrier frequency for said demodulator and said frequency converter when said comparator circuit judges that said received signal is present, said carrier frequency estimator having an output control signal; and
   voltage control frequency generation means for generating said frequency conversion signal to variably control said frequency converter in accordance with said output control signal of said carrier frequency estimator, wherein the narrow-filtered output signals are provided to said demodulator in accordance with said output control signal of said carrier frequency estimator.

2. A received signal detector as claimed in claim 1 wherein said received signal is a signal received in a satellite communications.

3. A received signal detector as claimed in claim 1 wherein said wide-band filter, said first average power measurement means, said threshold setting circuit, said frequency converter, said narrow-band filter, said second average power measurement means and said comparator circuit are all operated in digital signal processing.

4. A received signal detector as claimed in claim 1 wherein said wide-band filter and said narrow-band filter are an anti-aliasing filter and a Nyquist filter, respectively.

5. A received signal detector, comprising:
   a wide-band filter for suppressing signal components in a frequency band higher than allowed in a sampling of a received signal modulated by digital modulation, said wide-band filter having output signals;
   an A/D converter for sampling the output signals of said wide-band filter and converting said sampled output signals into digital signals;
   first averaged power measuring means for measuring an averaged power of said digital signals having passed through said A/D converter, said first averaged power measuring means having a first output signal;
   a threshold setting circuit for setting a threshold in accordance with the first output signal measured by said first averaged power measuring means;
   a frequency converter for converting a first frequency of said digital signals having passed through said A/D converter to a second frequency and for adjusting said second frequency into a frequency range of a narrow-band filter, said frequency converter inputting a frequency conversion signal and outputting converted output signals;

said narrow-bend filter filtering the converted output signals of said frequency converted, said narrow-bend filter having narrow-filtered output signals;

second average power measuring means for measuring the average power of the narrow-filtered output signals, said second average power measuring means having a second output signal;

a comparator circuit for comparing said threshold and said second output signal and judging whether said received signal is present or absent, said comparator circuit having a comparator output signal;

a voltage-controlled oscillator providing as an output said frequency conversion signal; and a frequency sweep control circuit for controlling said voltage control oscillator in accordance with said comparator output signal, such the said frequency conversion signal has a periodically changing oscillation frequency.

6. A received signal detector as claimed in claim 5 wherein said received signal is a signal received in a satellite communications.

7. A received signal detector as claimed in claim 5 wherein said wide-band filter, said first average power measurement means, said threshold setting circuit, said frequency converter, said narrow-band filter, said second average power measurement means and said comparator circuit are all operated in digital signal processing.

8. A received signal detector as claimed in claim 5 wherein said wide-band filter and said narrow-band filter are an anti-aliasing filter and a Nyquist filter, respectively.

9. A received signal detector, comprising:

a wide-band filter for suppressing signal components in a frequency band higher than allowed in a sampling of a received signal modulated by digital modulation, said wide-band filter having output signals;

an A/D converter for sampling the output signals of said wide-band filter and converting said sampled output signals into digital signals;

first averaged power measuring means for measuring an averaged power of said digital signals having passed through said A/D converter, said first averaged power measuring mean having a first output signal;

a threshold setting circuit for setting a threshold in accordance with the first output signal measured by said first averaged power measuring means;

a frequency converter for converting a first frequency of said digital signals having passed through said A/D converter to a second frequency and for adjusting said second frequency into a frequency range of a narrow-band filter, said frequency converter outputting converted output signals;

said narrow-band filter filtering the converted output signals of said frequency converter, said narrow-band filter having narrow-filtered output signals;

a demodulator that receives and demodulates the narrow-filtered output signals;

second averaged power measuring means for measuring the averaged power of the narrow-filtered output signals, said second averaged power measuring means having a second output signal;

a comparator circuit for comparing said threshold and said second output signal and judging whether said received signal is present or absent, said comparator circuit having a comparator output signal;

bit synchronization means for controlling a clock phase control operation from a signal demodulated by said demodulator, and for demodulating said narrow-filtered output signals according to said comparator output signal;

loop-band switching means for switching a loop band of said demodulator between a narrow band and a wide band; and automatic frequency control (AFC) means for controlling an AFC operation when said comparator circuit detects a presence said received signal and for holding said AFC control operation when said comparator circuit detects an absence of said received signal.

10. A received signal detector as claimed in claim 9 wherein said received signal is a signal received in a satellite communications.

11. A received signal detector as claimed in claim 9 wherein said wide-band filter, said first average power measurement means, said threshold setting circuit, said frequency converter, said narrow-band filter, said second average power measurement means and said comparator circuit are all operated in digital signal processing.

12. A received signal detector as claimed in claim 9 wherein said wide-band filter and said narrow-band filter are an anti-aliasing filter and a Nyquist filter, respectively.

13. A received signal detector, comprising:

a wide-band filter for suppressing signal components in a frequency band higher than allowed in a sampling of a received signal modulated by digital modulation, said wide-band filter having output signals;

an A/D converter for sampling the output signals of said wide-band filter and converting said sampled output signals into digital signals;

first averaged power measuring means for measuring an averaged power of said digital signals having passed through said A/D converter, said first averaged power measuring means having a first output signal;

a threshold setting circuit for setting a threshold in accordance with the first output signal measured by said first averaged power measuring means;

a frequency converter for converting a first frequency of said digital signals having passed through said A/D converter to a second frequency and for adjusting said second frequency into a frequency range of a narrow-band filter, said frequency converter outputting converted output signals;

said narrow-band filter filtering the converted output signals of said frequency converter, said narrow-band filter having narrow-filtered output signals;

a demodulator that receives and demodulates the narrow-filtered output signals;

second averaged power measuring means for measuring the averaged power of the narrow-filtered output signals, said second averaged power measuring means having a second output signal;

a comparator circuit for comparing said threshold and said second output signal and judging whether said received signal is present or absent;

wherein said threshold is set so that a voltage divided from said first output signal is a voltage between said second output signal at the time of a presence of said received signal and said second output signal at a time of an absence of said received signal.

14. A received signal detector as claimed in claim 13 wherein said received signal is a signal received in a satellite communications.

15. A received signal detector as claimed in clam 13 wherein said wide-band filter, said first average power measurement means, said threshold setting circuit, said frequency converter, said narrow-band filter, said second average power measurement means and said comparator circuit are all operated in digital signal processing.

16. A received signal detector as claimed in claim 13 wherein said wide-band filter and said narrow-band filter are an anti-aliasing filter and a Nyquist filter, respectively.

* * * * *